United States Patent
Wempe et al.

(10) Patent No.: US 10,879,925 B2
(45) Date of Patent: Dec. 29, 2020

(54) METHOD FOR GENERATING A DIGITAL SIGNAL FROM AN ANALOG SIGNAL, AND FREQUENCY CONVERTER

(71) Applicant: Lenze Automation GmbH, Aerzen (DE)

(72) Inventors: Andreas Wempe, Aerzen (DE); Dirk Duesterberg, Emmerthal (DE)

(73) Assignee: Lenze Automation GmbH, Aerzen (DE)

( * ) Notice: Subject to any disclaimer, the term of this patent is extended or adjusted under 35 U.S.C. 154(b) by 0 days.

(21) Appl. No.: 16/325,591

(22) PCT Filed: Aug. 18, 2017

(86) PCT No.: PCT/EP2017/070927
§ 371 (c)(1),
(2) Date: Feb. 14, 2019

(87) PCT Pub. No.: WO2018/033624
PCT Pub. Date: Feb. 22, 2018

(65) Prior Publication Data
US 2019/0215006 A1    Jul. 11, 2019

(30) Foreign Application Priority Data
Aug. 19, 2016   (DE) .......... 10 2016 215 657

(51) Int. Cl.
*H03M 3/00* (2006.01)
*H02M 7/5395* (2006.01)
(Continued)

(52) U.S. Cl.
CPC ......... *H03M 3/462* (2013.01); *H02M 7/5395* (2013.01); *H02P 27/08* (2013.01); *H03M 1/001* (2013.01); *H03M 3/30* (2013.01)

(58) Field of Classification Search
CPC ........ H03M 3/462; H03M 3/30; H03M 7/304; H03M 1/12; H03M 1/1071; H03M 1/001; H02M 7/5395; H02P 27/08
(Continued)

(56) References Cited

U.S. PATENT DOCUMENTS 4,924,370 A * 5/1990 Toelle ................. H02M 7/5152
363/138
7,058,464 B2   6/2006 Mallinson
(Continued)

FOREIGN PATENT DOCUMENTS

CN        1853344 A    10/2006
CN      101667834 A     3/2010
(Continued)

OTHER PUBLICATIONS

Beis U., "An Introduction to Delta Sigma Converters", Feb. 19, 2016, http://beis.de/Elektronik/DeltaSigma/DeltaSigma.html (10 pages).
(Continued)

*Primary Examiner* — Eduardo Colon Santana
*Assistant Examiner* — Zemenay T Truneh
(74) *Attorney, Agent, or Firm* — Crowell & Moring LLP

(57) ABSTRACT

A method produces a digital signal from an analog signal. The method includes: producing a pulse-width-modulated actuation signal by a frequency converter, wherein the pulse-width-modulated actuation signal is produced over a number n of periods of the pulse width modulation such that the signal curve of the pulse-width-modulated actuation signal is identical in the respective periods; applying the actuation signal to a load; producing a bitstream with a predetermined bit repetition duration depending on an analog signal to be measured by a sigma-delta modulator, wherein the analog signal to be measured depends on the actuation signal and on the load, wherein a number m of bits
(Continued)

are produced and stored with the predetermined bit repetition duration over a respective period of the pulse-width-modulated actuation signal; and summing corresponding bits of the respective periods in order to form the digital signal.

8 Claims, 2 Drawing Sheets

(51) Int. Cl.
*H02P 27/08* (2006.01)
*H03M 1/00* (2006.01)

(58) Field of Classification Search
USPC .......... 318/503; 314/143, 155, 77, 126, 120; 341/143
See application file for complete search history.

(56) References Cited

U.S. PATENT DOCUMENTS

| | | | |
|---|---|---|---|
| 7,675,448 | B1 | 3/2010 | Huang et al. |
| 8,736,473 | B2 | 5/2014 | Dijkmans et al. |
| 9,154,033 | B2 | 10/2015 | Hoshino et al. |
| 2014/0226709 | A1* | 8/2014 | Duesterberg ........ H04L 25/4902 375/238 |

FOREIGN PATENT DOCUMENTS

| | | |
|---|---|---|
| CN | 102377436 A | 3/2012 |
| DE | 11 2012 002 958 T5 | 4/2014 |
| JP | 2012-37494 A | 2/2012 |

OTHER PUBLICATIONS

International Search Report (PCT/ISA/210) issued in PCT Application No. PCT/EP2017/070927 dated Dec. 1, 2017 with English translation (four (4) pages).
German-language Written Opinion (PCT/ISA/237) issued in PCT Application No. PCT/EP2017/070927 dated Dec. 1, 2017 (eight (8) pages).
Chinese-language Office Action issued in Chinese Application No. 201780050633.5 dated Jun. 15, 2020 (seven pages).

* cited by examiner

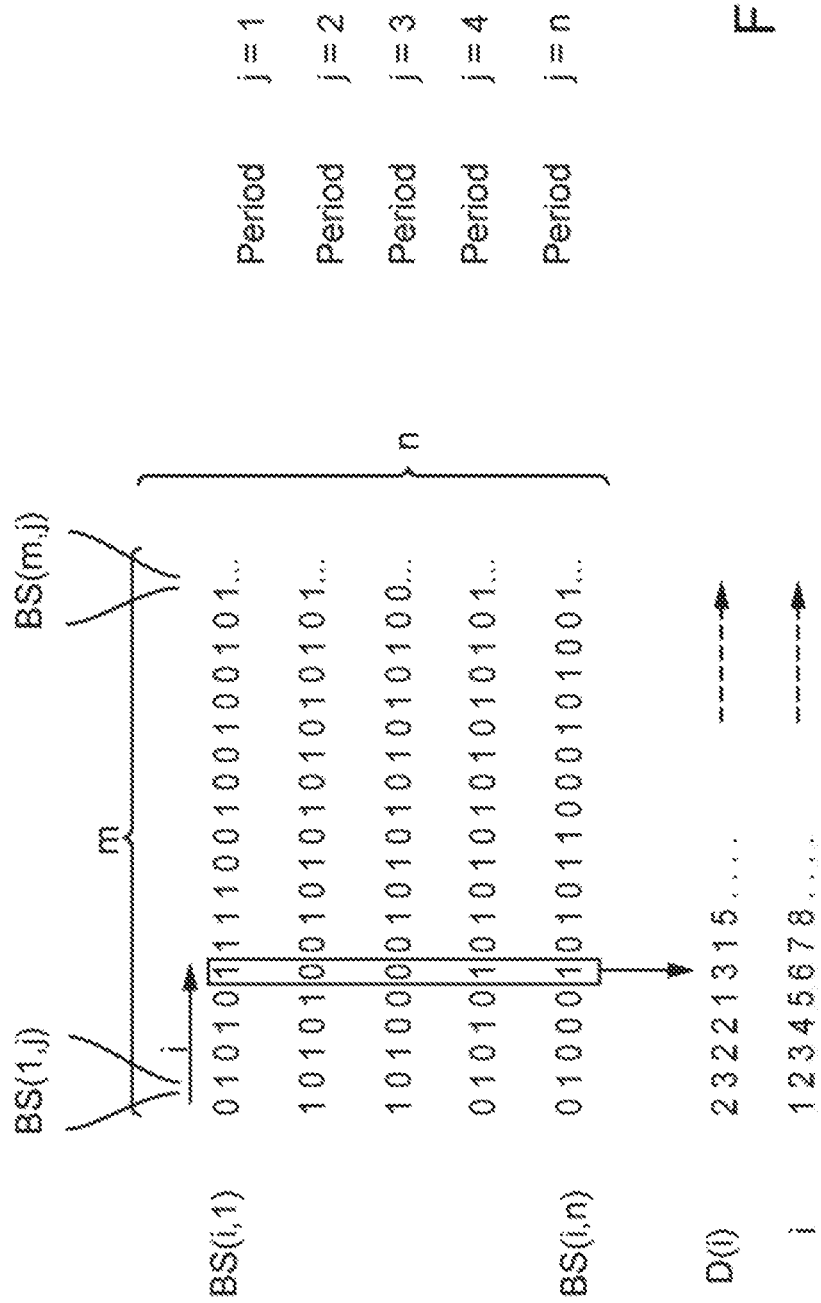

METHOD FOR GENERATING A DIGITAL SIGNAL FROM AN ANALOG SIGNAL, AND FREQUENCY CONVERTER

BACKGROUND AND SUMMARY OF THE INVENTION

The invention relates to a method for producing a digital signal from an analog signal and to a frequency converter.

The invention is based on the object of providing a method for producing a digital signal from an analog signal and a frequency converter, which render it possible to capture the analog signal with a high temporal resolution with, at the same time, low costs.

The invention achieves this object by a method for producing a digital signal from an analog signal, including the steps of producing a pulse-width-modulated actuation signal by a frequency converter, wherein the pulse-width-modulated actuation signal is produced over a number n of periods of the pulse width modulation such that the signal curve of the pulse-width-modulated actuation signal is identical in the respective periods; applying the actuation signal to a load; producing a bitstream with a predetermined bit repetition duration depending on an analog signal to be measured by a sigma-delta modulator, wherein the analog signal to be measured depends on the actuation signal and on the load, wherein a number m of bits are produced and stored with the predetermined bit repetition duration over a respective period of the pulse-width-modulated actuation signal; and summing corresponding bits of the respective periods in order to form the digital signal.

The invention also achieves this object by providing a frequency converter having a sigma-delta modulator and an evaluation unit coupled to the sigma-delta modulator, wherein the frequency converter is embodied to carry out the method.

The method according to the invention for producing a digital signal from an analog signal includes the following steps.

A pulse-width-modulated actuation signal is produced in conventional fashion by means of a frequency converter, for example by way of a bridge circuit of the frequency converter being actuated in suitable fashion. In this respect, reference is also made to the relevant specialist literature.

The pulse-width-modulated actuation signal is produced over a number n (n=2, 3, . . . ) of periods of the pulse width modulation in such a way that the signal curve of the pulse-width-modulated actuation signal is identical in the respective periods. By way of example, the pulse-width-modulated actuation signal can be produced over the number n of periods of the pulse width modulation in such a way that a duty factor within the periods is identical. By way of example, the number n can lie between 128 and 32 768 and can depend on the desired amplitude resolution of the digital signal.

The actuation signal is applied to an electric load. By way of example, if the actuation signal is a pulse-width-modulated voltage, the voltage is applied to the load.

A bitstream with a predetermined bit repetition duration, in particular a constant bit repetition duration, is produced in conventional fashion by means of a sigma-delta modulator depending on an analog signal to be measured. Here, the analog signal to be measured depends on the actuation signal and the electrical properties of the load 2, for example on an impedance of the load. A number m (m=2, 3, . . . ) of bits with the predetermined bit repetition duration are produced and stored by means of the sigma-delta modulator during each of the n periods of the pulse-width-modulated actuation signal. By way of example, the number m can be chosen in such a way that bits are produced over a respective complete period. The period duration can be completely divisible (without remainder) by the bit repetition duration, where m=PD/BW applies, where PD denotes the period duration and BW denotes the bit repetition duration.

Then, temporally corresponding bits of the respective periods are summed to form the digital (multi-bit) signal. This means that, for example, the temporally first bits of the respective periods are summed, the temporally second bits of the respective periods are summed, etc. The digital signal typically has an amplitude resolution of 7 to 15 bits, depending on the number n.

The invention renders it possible to obtain, by means of a conventional sigma-delta modulator, a signal with a temporal resolution that cannot be obtained by the conventional application of the sigma-delta modulator with a downstream bitrate reduction. The invention is based on the discovery that the signal curve of the analog signal can be averaged over a plurality of periods on account of the actuation signal that is produced identically for each period, as a result of which modulator noise, but not the signal components to be captured, is averaged out.

In one embodiment, the load is an electric line and a motor winding connected thereto. Charge-reversal currents are captured or established on the basis of the digital signal, said charge-reversal currents being caused by the pulse-width-modulated signal.

In one embodiment, the actuation signal is a pulse-width-modulated actuation voltage, wherein a shunt resistor is looped in between an output connector of the frequency converter and the load, wherein the analog signal to be measured is present at the shunt resistor or drops across the shunt resistor.

In one embodiment, the bit repetition duration lies in a range between 20 ns and 100 ns.

In one embodiment, a period duration of the pulse width modulation lies in a range between 20 μs and 1000 μs.

The frequency converter comprises a sigma-delta modulator and an evaluation unit coupled to the sigma-delta modulator, wherein the frequency converter is embodied to carry out a method as described above.

Particularly in the case of long leads, high charge-reversal currents may occur in frequency converters as a result of the switching edges caused by the PWM. Using the present invention, these can be captured using conventional sigma-delta modulators even though these converters are technically unable to do this within the scope of conventional use. By capturing these charge-reversal currents, it is possible to establish parameters such as line length and capacitance and derive appropriate measures herefrom, for example power/frequency derating. Furthermore, it is possible to derive a refined motor model. Likewise, an improved diagnosis/design of the entire drive system is possible.

The charge-reversal processes occur in the lower MHz range. In this range, sigma-delta modulators, however, have a very high noise component (noise shaping) due to the operating principles thereof. Conventionally, this noise due to the operating principles thereof is removed in downstream decimation filters, as result of which, however, the signal components of the charge-reversal processes are also suppressed. Furthermore, the sampling rates downstream of a decimation filter typically lie in the region around 10-100 kHz, and so it is not possible to represent signals in the MHz range.

According to the invention, a constant duty factor is output by the frequency converter over a certain time period, wherein the bitstream of the sigma-delta modulator is captured in synchronous fashion with the pulse width modulation over a plurality of periods of the pulse width modulation. The corresponding bits of a respective period are now added in order to obtain a signal with a higher amplitude resolution. Expressed differently, respectively one data series with m bits is captured for each of the n PWM periods. The respective bits of the corresponding temporal positions (1 . . . m) of the captured data series are added, and so m multi-bit values or summed values of a results series arise. These m multi-bit values correspond to the signal curve over a time interval with a duration of m bit repetition durations. Here, the PWM pattern is strictly periodic during the measurement.

Thus, as a result, a sampling rate at the modulator clock is obtained, for example 20 Msample/s. Furthermore, the noise of the modulator is suppressed since it is random while the signal to be captured, however, is repetitive. Hence, it is possible to dispense with a conventional filter in the time domain. An optionally present low-pass filter upstream of the input of the sigma-delta modulator can be compensated by a correction of the frequency response (digital high-pass filter).

The invention is described in detail below with reference to the drawings.

BRIEF DESCRIPTION OF THE DRAWINGS

FIG. 2 shows bit arrays captured by means of the sigma-delta modulator within successive periods of a pulse width modulation.

DETAILED DESCRIPTION OF THE DRAWINGS

Figure 1:
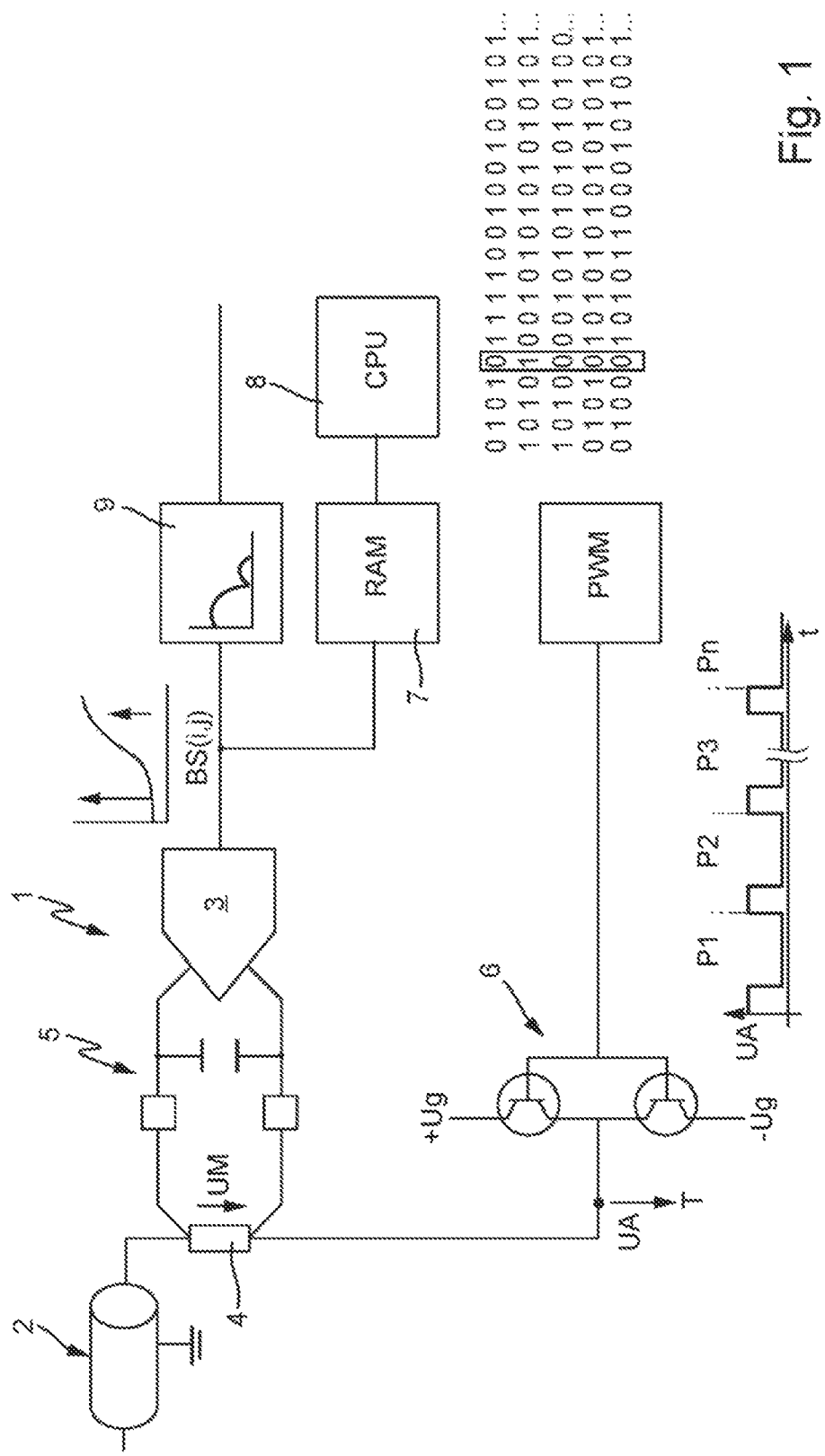
FIG. 1 shows a frequency converter embodied to capture and evaluate high-frequency charge-reversal processes on motor leads by means of a conventional sigma-delta modulator.

FIG. 1 shows a frequency converter 1, which produces a pulse-width-modulated actuation signal UA in the form of a pulse-width-modulated actuation voltage in a conventional fashion by means of a schematically illustrated bridge circuit 6. In this respect, reference is also made to the relevant specialist literature.

The pulse-width-modulated actuation signal UA is produced over a number n of periods P1 to Pn of the pulse width modulation in such a way that the signal curve of the pulse-width-modulated actuation signal UA is identical in the respective periods P1 to Pn.

The actuation signal UA is applied to an electric load 2 in the form of an electric line and a motor winding connected thereto (not explicitly illustrated), with the interposition of a shunt resistor 4.

An analog signal UM to be measured drops across the shunt resistor 4, said analog signal to be measured being led to an input of a conventional sigma-delta modulator 3 having been low-pass-filtered by means of a low-pass filter 5.

The sigma-delta modulator 3 produces a bitstream BS(i,j) with a predetermined bit repetition duration in conventional fashion, depending on the analog signal UM to be measured.

Typically, the bit repetition duration lies in a range between 20 ns and 100 ns.

Typically, a period duration of the pulse width modulation lies in a range between 20 μs and 1000 μs.

The pulse-width-modulated actuation signal UA is produced over a number n of periods P1 to Pn of the pulse width modulation by way of the frequency converter 1 in such a way that the signal curve of the pulse-width-modulated actuation signal UA is identical in the respective periods P1 to Pn, in particular has an identical duty factor. In the shown embodiment, n=5.

FIG. 2 shows bit arrays captured by means of the sigma-delta modulator 3 within successive periods P1 to P5. The index i denotes a position of a bit within a respective period and the index j denotes the respective period. The bits B(i,j) are captured in synchronized fashion with the periods; i.e., bits of different periods with identical index i have an identical temporal position or alignment within the respective period.

A number m of bits B(i,j) with the predetermined bit repetition duration are produced over each period j of the pulse-width-modulated actuation signal UA and stored in a memory 7 of the frequency converter 1. In the shown embodiment, m=20.

A digital signal D(i) is calculated from an analog signal UM or from the bit array B(i,j) by an evaluation unit 8 of the frequency converter 1 as follows:

$$D(i) \Sigma_{j=1}^{n} BS(i,j)$$

where:
i denotes the position of the bit within a respective period,
j denotes the period,
n denotes the number of periods.

Consequently, temporally corresponding bits B(i,j) (i.e., with identical index i) of the respective periods are added to form the digital signal D(i).

Expressed differently, respectively one bit array with m bits is captured and stored for each period j of the n PWM periods. The respective bits of the corresponding positions i=1 . . . m of the captured bit arrays are added such that m multiple-bit values of a results series arise, these forming the digital signal D(i). By way of example, the digital signal D(i) can have an amplitude resolution of between 7 and 15 bits. Here, the PWM pattern of the actuation signal UA is strictly periodic during the measurement. After a measurement, the actuation signal UA can be produced in changeable fashion in the respective periods of the pulse width modulation.

All bit values in the memory 7 are reset at the start of the production of the digital signal D(i).

By means of the digital signal D(i), the evaluation unit 8 establishes charge-reversal currents, which are caused by the pulse-width-modulated signal UA.

Further, the frequency converter 1 comprises a conventional decimation filter 9, which has an over-sampling ratio of 128 and a 3rd order filter, for example, and so the usable bandwidth is approximately 40 kHz. Conventionally, the output signal of the decimation filter 9 is used for actual values of different closed-loop/open-loop control problems.

High charge-reversal currents caused by switching edges can occur in frequency converters, particularly in the case of long electrical lines. Using the present invention, these can be captured using conventional sigma-delta converters.

In conventional solutions, capturing the aforementioned switching edges is not possible as a matter of principle since the high-frequency signal to be measured is suppressed.

By way of example, the digital signal D(i) captured according to the invention facilitates the establishment of parameters in the form of a frequency of charge-reversal processes, a level of the charge-reversal currents, a decay behavior of the charge-reversal currents and a capacitance and/or an impedance of the motor lead.

By way of example, a line length can be derived from the frequency of the charge-reversal processes.

The level of the charge-reversal currents allows improved derating of the converter (i*t monitoring).

Further, a refined motor model can be derived on the basis of the captured digital signal D(i).

By way of example, at start-up, it is possible to establish power losses by charge-reversal processes in order to optimally parameterize the installation. By way of example, this can be an adaptation of the switching frequency.

A fine adjustment of converter dead times is likewise conceivable. The use of the established parameters in service could also be advantageous in order to detect changes in the properties of the motor line (clamped line, removed line, modified reaction of the motor winding) or to output a warning in the case of inadmissible line lengths/charge-reversal currents that are too high.

The decay behavior can be a measure of the ohmic component of the line.

Further, it is possible to establish and assess PE discharge currents (level and frequency/curve).

Additionally, an overcurrent identification (level/filter properties) can be implemented on the basis of the parameters.

In the case of fast semiconductor switches, a filter is necessary in the case of long lines in order to avoid inadmissibly high charge-reversal currents. The invention renders it possible to determine whether a necessary filter is also present, or whether a filter that is present is sufficient.

What is claimed is:

1. A method for producing a digital signal from an analog signal, the method comprising the steps of:
    producing a pulse-width-modulated actuation voltage by a frequency converter, wherein the pulse-width-modulated actuation voltage is produced over a number n in such a way that a signal curve of the pulse-width-modulated actuation voltage is identical in respective periods;
    applying the pulse-width-modulated actuation voltage to a load comprising an electric line and a motor winding connected thereto;
    producing a bitstream with a predetermined bit repetition duration depending on the analog signal to be measured by a sigma-delta modulator, wherein the analog signal to be measured depends on the pulse-width-modulated actuation voltage and on the load, wherein a number m of bits are produced and stored with the predetermined bit repetition duration over the respective periods of the pulse-width-modulated actuation voltage; and
    summing corresponding bits of the respective periods in order to form the digital signal, wherein
    charge-reversal currents are captured on the basis of the digital signal, said charge-reversal currents being caused by the pulse-width-modulated actuation voltage; and
    a shunt resistor is looped in between an output connector of the frequency converter and the load, wherein the analog signal to be measured is present at the shunt resistor.

2. The method as claimed in claim 1, wherein the predetermined bit repetition duration lies in a range between 20 ns and 100 ns.

3. The method as claimed in claim 2, wherein a period duration lies in a range between 20 μs and 1000 μs.

4. The method as claimed in claim 2, wherein a period duration lies in a range between 20 μs and 1000 μs.

5. A frequency converter, comprising:
a sigma-delta modulator; and
an evaluation unit coupled to the sigma-delta modulator, wherein the frequency converter is configured to carry out the steps of:
    producing a pulse-width-modulated actuation voltage by means of the a frequency converter, wherein the pulse-width-modulated actuation voltage is produced over a number n in such a way that a signal curve of the pulse-width-modulated actuation voltage is identical in respective periods;
    applying the pulse-width-modulation actuation voltage to a load;
    producing a bitstream with a predetermined bit repetition duration depending on an analog signal to be measured by the sigma-delta modulator, wherein the analog signal to be measured depends on the pulse-width-modulated actuation voltage and on the load, wherein a number m of bits are produced and stored with the predetermined bit repetition duration over a respective period of the pulse-width-modulated actuation voltage; and
    summing corresponding bits of the respective periods in order to form a digital signal,
wherein a shunt resistor is looped in between an output connector of the frequency converter and the load, wherein the analog signal to be measured is present at the shunt resistor.

6. The frequency converter as claimed in claim 5, wherein the load is an electric line and a motor winding connected thereto, and
    charge-reversal currents are captured on the basis of the digital signal, said charge-reversal currents being caused by the pulse-width-modulated actuation voltage.

7. The frequency converter as claimed in claim 5, wherein the predetermined bit repetition duration lies in a range between 20 ns and 100 ns.

8. The frequency converter as claimed in claim 5, wherein a period duration lies in a range between 20 μs and 1000 μs.

* * * * *